(12) United States Patent
Catabay et al.

(10) Patent No.: US 6,727,177 B1
(45) Date of Patent: Apr. 27, 2004

(54) MULTI-STEP PROCESS FOR FORMING A BARRIER FILM FOR USE IN COPPER LAYER FORMATION

(75) Inventors: Wilbur G. Catabay, Saratoga, CA (US); Zhihai Wang, Sunnyvale, CA (US); Ping Li, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/035,704

(22) Filed: Oct. 18, 2001

(51) Int. Cl.[7] ............. H01L 21/44; H01L 21/4763
(52) U.S. Cl. ............. 438/687; 438/627; 438/628; 438/643; 438/644
(58) Field of Search ............. 438/694, 687, 438/689, 678, 627, 628, 643, 644; 257/751, 759, 762

(56) References Cited

U.S. PATENT DOCUMENTS

| | | | |
|---|---|---|---|
| 5,925,415 A | | 7/1999 | Fry et al. |
| 6,010,962 A | | 1/2000 | Liu et al. |
| 6,015,749 A | | 1/2000 | Liu et al. |
| 6,022,808 A | * | 2/2000 | Nogami et al. ............ 216/17 |
| 6,037,258 A | | 3/2000 | Liu et al. ............ 438/687 |
| 6,042,889 A | | 3/2000 | Ballard et al. |
| 6,066,892 A | * | 5/2000 | Ding et al. ............ 257/751 |
| 6,162,727 A | | 12/2000 | Schonauer et al. |
| 6,235,406 B1 | | 5/2001 | Uzoh |
| 6,255,192 B1 | | 7/2001 | Dornisch |
| 6,268,291 B1 | * | 7/2001 | Andricacos et al. ........ 438/694 |
| 6,287,968 B1 | | 9/2001 | Yu et al. |
| 6,297,158 B1 | | 10/2001 | Liu et al. |
| 6,328,871 B1 | | 12/2001 | Ding et al. |
| 6,368,967 B1 | | 4/2002 | Besser |
| 6,376,370 B1 | * | 4/2002 | Farrar ............ 257/762 |
| 6,391,777 B1 | | 5/2002 | Chen et al. |
| 6,429,121 B1 | | 8/2002 | Hopper et al. |
| 6,440,849 B1 | * | 8/2002 | Merchant et al. ........ 438/658 |
| 6,445,070 B1 | * | 9/2002 | Wang et al. ............ 257/751 |
| 6,461,675 B2 | | 10/2002 | Paranjpe et al. |
| 6,465,376 B2 | | 10/2002 | Uzoh et al. |

OTHER PUBLICATIONS

Wolf, et al. Silicon Processing for the VLSI Era, vol. 1–Process Technology, 2nd ed., Lattice Press: Sunset Beach, CA, 2000, pp. 791–795.*

U.S. patent application No. 10/035,705 "Electroless Deposition of Copper to Form Copper Interconnect Structures", filed Oct. 18, 2001.

Peter Van Zant, "Microchip Fabrication", Third Edition, Chapter 13, Sep. 1996.

* cited by examiner

*Primary Examiner*—Erik J. Kielin
(74) *Attorney, Agent, or Firm*—Beyer Weaver Thomas

(57) ABSTRACT

Embodiments of the invention include a method for forming a copper interconnect having a bi-layer copper barrier layer. The method involves providing a substrate having an insulating layer with an opening therein configured to receive an inlaid conducting structure. A copper seed layer is formed on the insulating layer and in the opening. The seed layer is implanted with barrier material ions to form an implanted seed layer. Upon the implanted seed layer is formed a bulk copper-containing layer. The substrate is then annealed so that barrier material ions migrate through the seed layer to an interface between the seed layer and the insulating layer to form a final barrier layer. The barrier material can include palladium, chromium, tantalum, magnesium, and molybdenum.

21 Claims, 8 Drawing Sheets

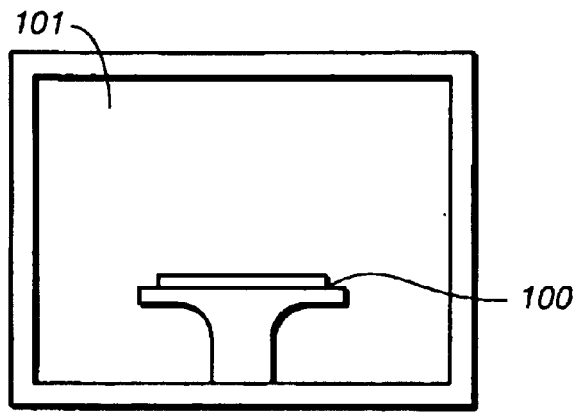
FIG._1 (PRIOR ART)
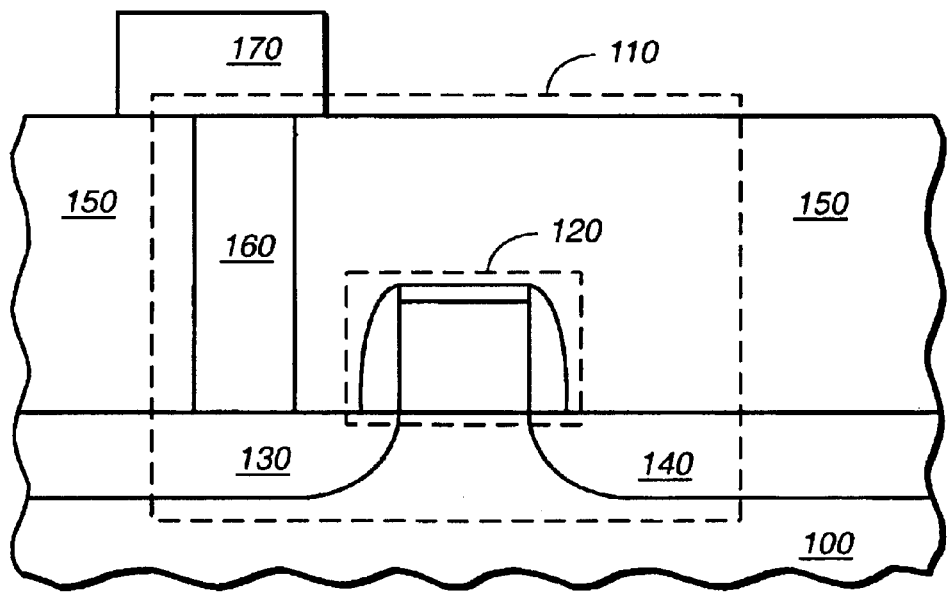
FIG._2 (PRIOR ART)

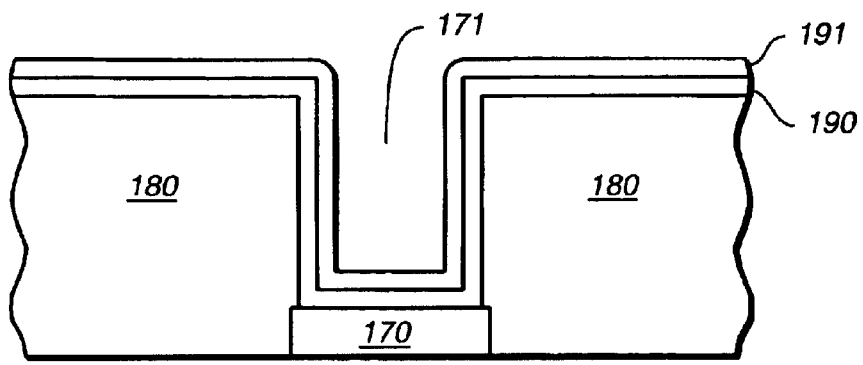
FIG._3 (PRIOR ART)
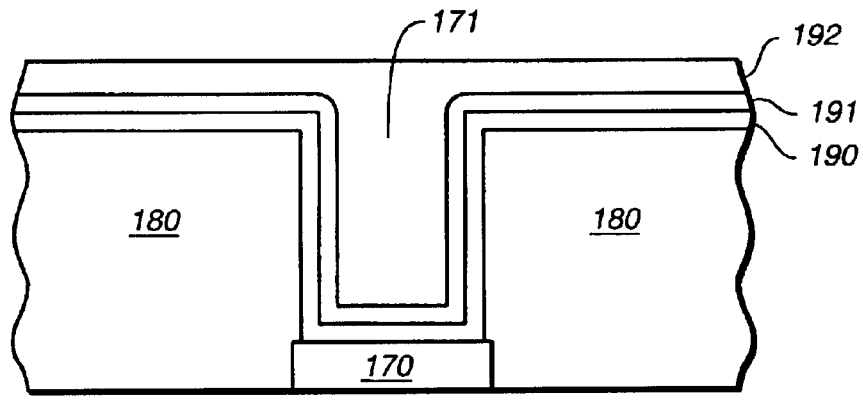
FIG._4 (PRIOR ART)
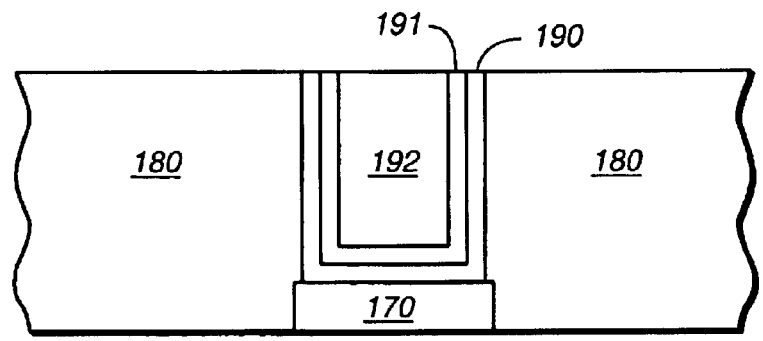
FIG._5 (PRIOR ART)

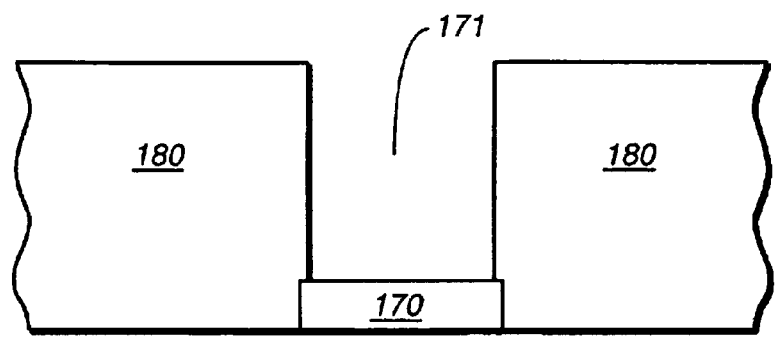
FIG._6A
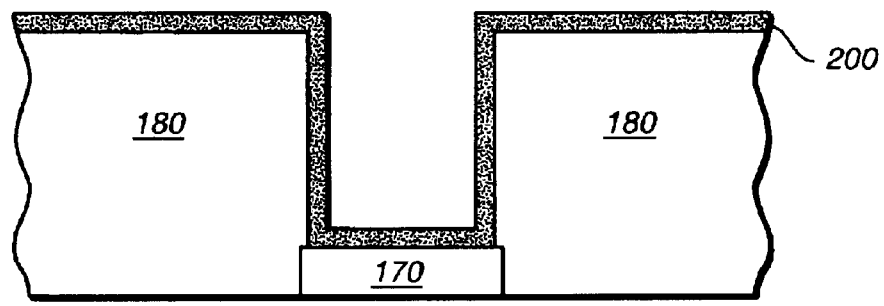
FIG._6B
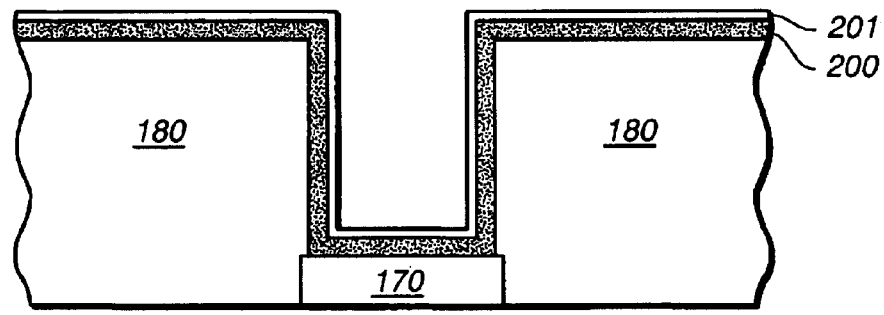
FIG._6C

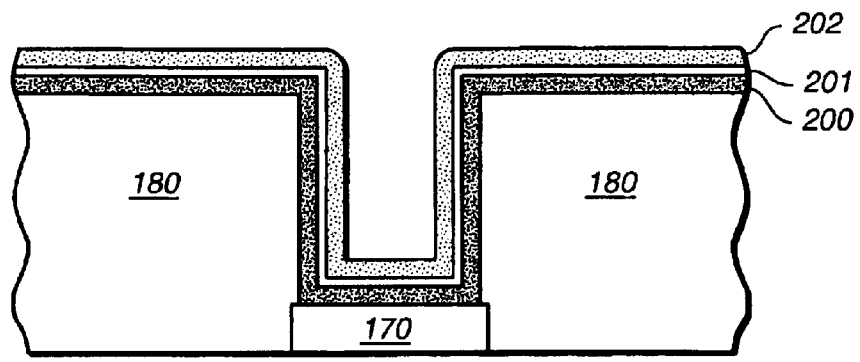
FIG. _6D
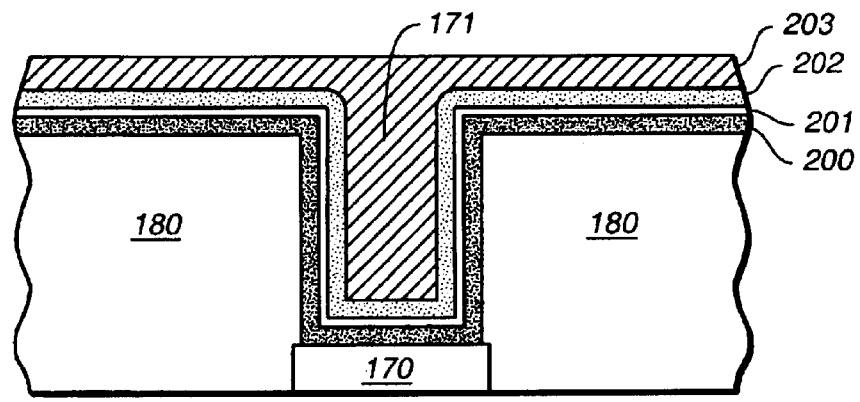
FIG. _6E
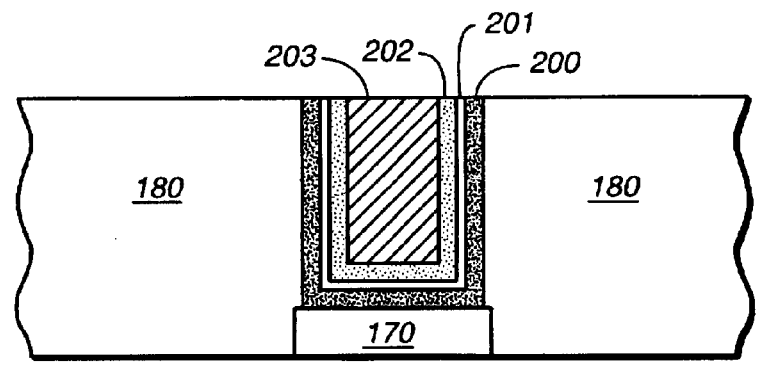
FIG. _6F

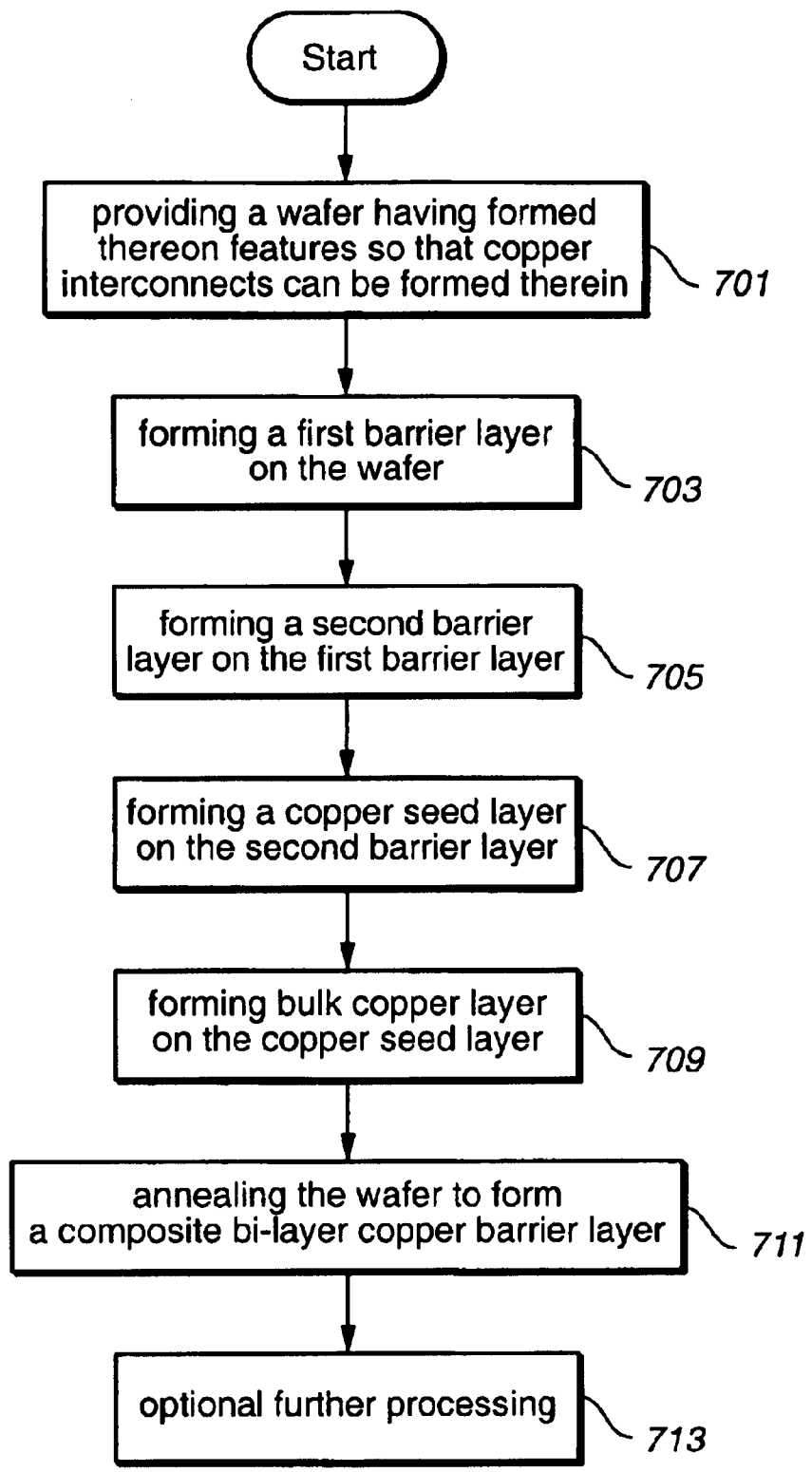
FIG._7

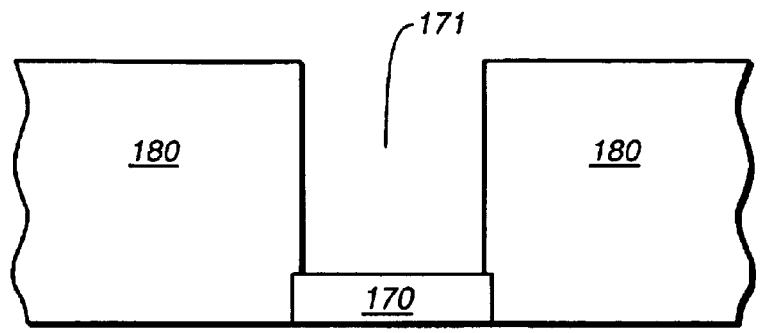
FIG._8A
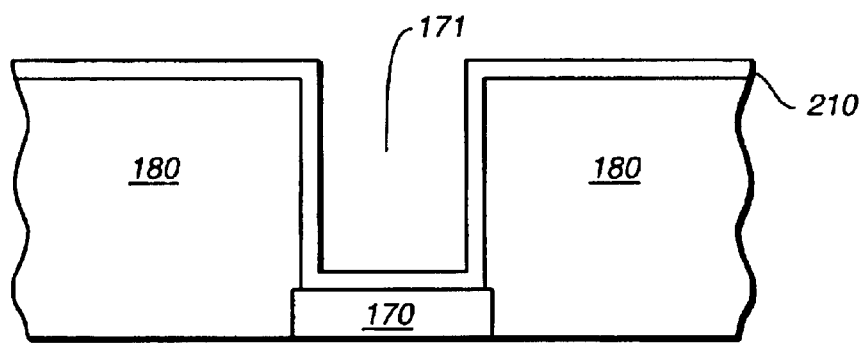
FIG._8B
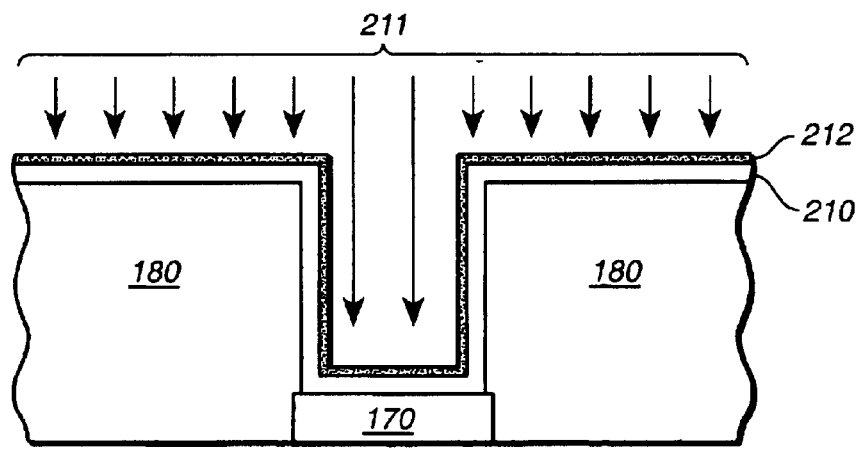
FIG._8C

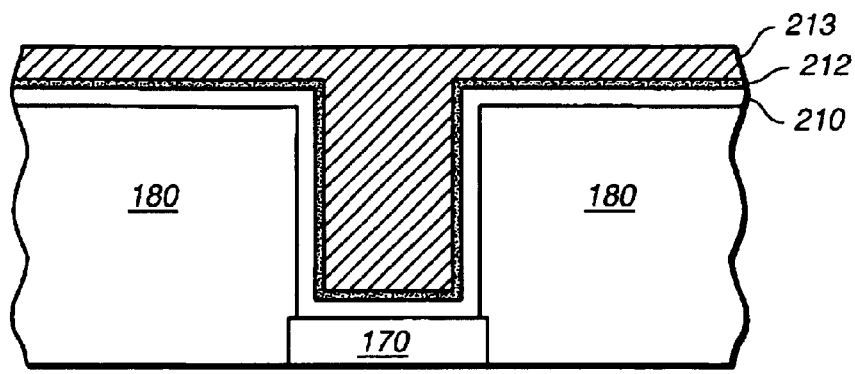
FIG._8D
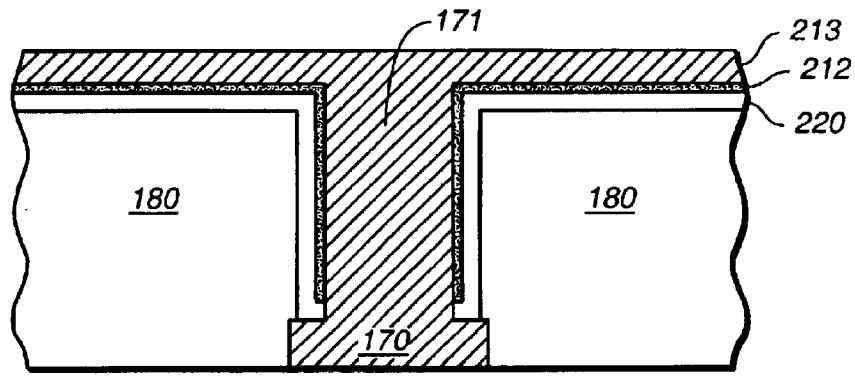
FIG._8E
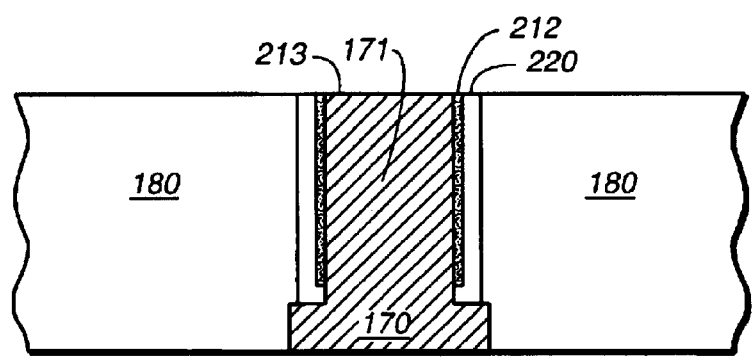
FIG._8F

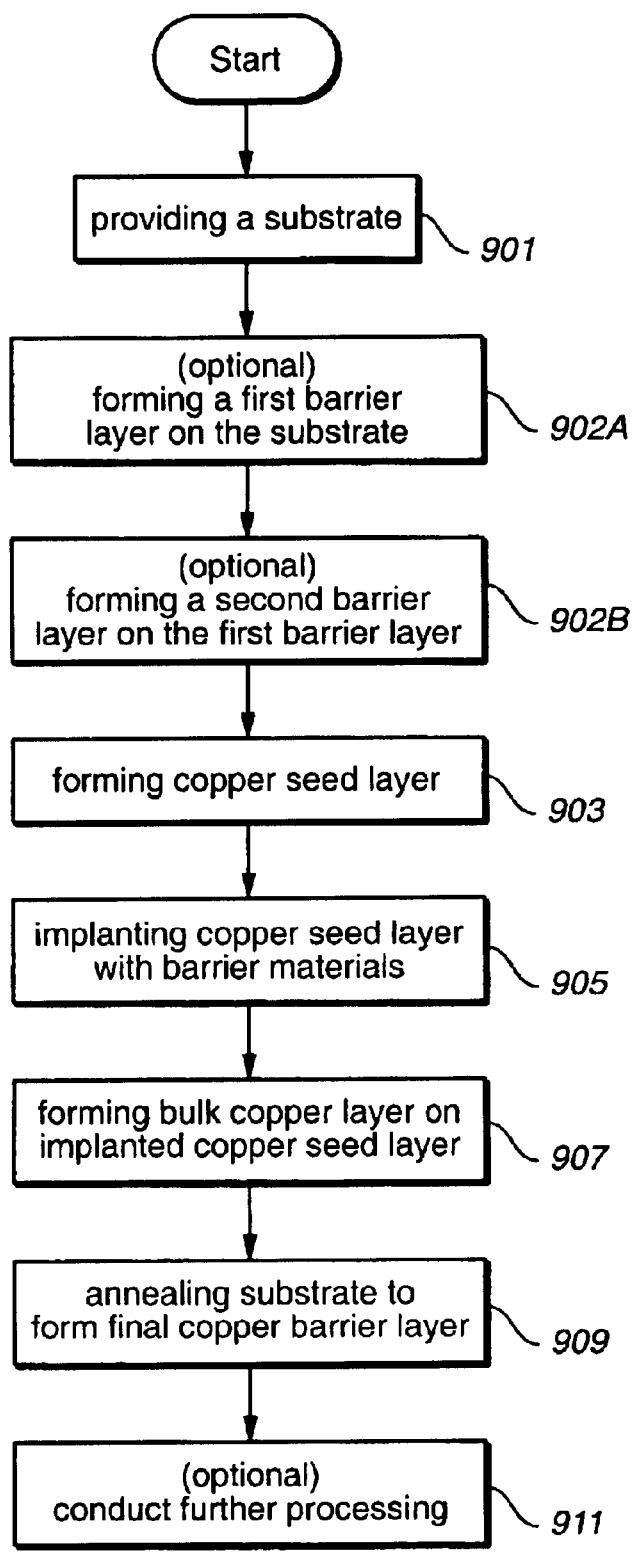
FIG._9

MULTI-STEP PROCESS FOR FORMING A BARRIER FILM FOR USE IN COPPER LAYER FORMATION

TECHNICAL FIELD

The invention described herein relates generally to semiconductor devices and processing. In particular, the invention relates to semiconductor devices and processes incorporating improved barrier layer structures between copper material and other layers of material. And most particularly, the invention relates improved barrier layers between copper material and low-K dielectric materials and methods of forming such devices.

BACKGROUND

The semiconductor industry has moved to using copper in various aspects of semiconductor devices due to certain advantages of copper over other metals. Copper has a first advantage of having lower resistivity than, for example, aluminum. As a result, copper circuitry suffers less from resistance-capacitance (RC) delays. This makes copper systems faster. Further, copper has increased resistance to electromigration, thereby enabling smaller scaling of semiconductor devices. However, with increased use, certain problems particular to copper have become more prevalent. One such problem is that copper has a high diffusivity through dielectric and silicon materials on which the copper is deposited. This is especially the case for so-called low-K dielectric materials, which are coming into increasingly common usage. This is problematic because the presence of copper in these materials may "poison" the materials and lead to semiconductor device failure.

In conventional methodologies, a barrier material is typically deposited on the dielectric material between the copper layer and the dielectric (or silicon) material, thereby preventing the copper from diffusing into the dielectric or silicon material. Typically, tantalum (Ta) or titanium (Ti) based barrier materials (e.g., tantalum nitrides (TaN), tantalum silicon nitrides (TaSiN), or titanium nitrides (TiN)) are used as barrier layers for copper. However, such materials also have limitations. For example, they can have porous boundaries which create a diffusion path for copper. Additionally, the thickness of existing barrier layers create some difficulties as feature size decreases. This is especially true as feature sizes decrease below 0.35 micron (:).

A conventional prior art process for creating a copper interconnect is described hereinbelow with respect to FIGS. 1–5. In FIG. 1, a typical semiconductor wafer 100 is placed in a process chamber 101 and various layers of material and circuit structures are formed thereon.

FIG. 2 is a cross-sectional view of an active device and first metal layer of a semiconductor device formed on the wafer (or substrate) 100 of FIG. 1. In FIG. 2, the substrate 100, typically silicon, has an active device 10 formed thereon. The active device 110 has a gate region 120 on the substrate 100, and a source region 130 and a drain region 140 in the substrate 100. The active device 110 is fabricated using conventional techniques known to one skilled in the art. A first insulating layer 150 is formed over the gate region 120 and down to the substrate 100, over the source region 130 and drain region 140. The first insulating layer is typically silicon dioxide; however, combinations of silicon dioxide and other doped dielectrics (e.g. BPSG, PSG) are also commonly used. FIG. 2 shows an opening 160 which has been formed in the first insulating layer 150 and subsequently filled with a metal-containing material such as tungsten. Other material including, but not limited to, copper and aluminum may also be used. The opening 160 has been depicted as a via, but other openings including, but not limited to, trenches and inter-level interconnect structures may also be used. A metallization layer 170 is deposited over the first insulating layer 150 and the first opening 160. The metallization layer 170 is typically copper, but may also be aluminum or tungsten. After the metallization layer 170 has been formed, material is removed to leave a metal plug 170 over the filled opening 160. This structure is then treated to form copper interconnects.

FIG. 3 shows the topmost portion of FIG. 2. In particular, the plug 170 is shown. An insulating layer 180 of low-K dielectric material is formed over the entire surface, including the plug 170. Then the region over the plug 170 is etched away to define a trench 171. Then, a barrier layer 190 is formed over the surface, including the trench 171. Such a barrier layer 190 is typically formed of TaN or other Ta containing barrier materials or TiN barrier materials. Typically, the barrier layer 190 is formed using PVD techniques. After forming the barrier layer 190, a copper seed layer 191 is formed over the barrier layer 190. The seed layer provides a conductive surface for use in subsequent bulk copper deposition, which is typically performed by electroplating. With reference to FIG. 4, a bulk copper layer 192 (which fills in the trench 171) is formed on copper seed layer 191. Such bulk copper layers 192 are often formed using electroplating, but other deposition techniques are also possible, as known to those of skill in the art. Further processing, for example chemical mechanical polishing (CMP), can be used to planarize the surface, as is shown in FIG. 5. The bulk copper layer 192 can also be sealed by the deposition of another layer of a barrier material.

For the reasons described hereinabove, as well as other reasons, an improved method of forming barrier layers for copper is needed.

SUMMARY OF THE INVENTION

In accordance with the principles of the present invention, an apparatus and method for fabricating a copper interconnect having an improved copper barrier layer is disclosed.

One embodiment comprises the steps of providing a substrate having an insulating layer and an opening in the insulating layer such that an inlaid conducting structure can be formed in the opening. Further steps include forming at least one barrier layer on the insulating layer and in the opening. A copper seed layer is formed on the at least one barrier layer and a bulk layer of copper-containing material is formed on the seed layer. The substrate is then annealed.

Another embodiment comprises the steps of providing a substrate in a processing chamber, the substrate having an insulating layer and an opening in the insulating layer. Further steps include forming a first barrier layer on the insulating layer and in the opening; and forming a second barrier layer on the first barrier layer. A copper seed layer is formed on the second barrier layer and a bulk layer of copper-containing material is formed on the seed layer. The substrate is then annealed.

A further embodiment includes an insulating layer comprised of a low-K dielectric material, a first barrier layer consisting of a material selected from among tantalum and tantalum nitride, and a second barrier layer comprised of a material selected from the group consisting of palladium, chromium, magnesium, and molybdenum.

Yet another embodiment comprises a method for forming a copper barrier layer. The method includes providing a substrate in a processing chamber and forming a copper seed layer on the substrate. The seed layer is implanted with barrier materials to form an implanted seed layer and a bulk copper-containing layer is formed on the implanted seed layer. The substrate is annealed to form a final barrier layer.

In a related embodiment, the step of forming a seed layer is replaced with the steps of forming a first barrier layer on the substrate and forming a copper seed layer on the first barrier layer. After implantation of barrier material into the seed layer and bulk deposition of copper-containing material, the substrate is annealed to form a final barrier layer.

In yet another related embodiment, the step of forming a seed layer is replaced with the steps of forming a first barrier layer on the substrate and forming a second barrier layer on the first layer. A copper seed layer is formed on the second barrier layer. After implantation of barrier material into the seed layer and bulk deposition of copper-containing material, the substrate is annealed to form a final barrier layer.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIGS. 1–5 describe a process for forming a conventional copper barrier layer.

FIG. 1 is a simplified figurative depiction of a semiconductor wafer in a process chamber.

FIG. 2 is a cross-sectional view of an active device and first metal layer of a semiconductor device formed on the wafer of FIG. 1.

FIGS. 3–5 are cross-sectional views of a semiconductor surface showing the topmost portion of FIG. 2 having a copper layer and conventional barrier layer being formed.

FIGS. 6A–6F are cross-sectional views of a semiconductor surface showing the topmost portion of FIG. 2 showing aspects of one exemplary process for forming a copper layer having a bi-layer copper barrier film for use in interconnect schemes in damascene and dual damascene processes.

FIG. 7 is a flowchart describing a suitable method embodiment for implementing a process for constructing a copper interconnect having a bi-layer copper barrier film in accordance with the principles of the present invention.

FIGS. 8A–8F are cross-sectional views of a semiconductor surface showing the topmost portion of FIG. 2 showing aspects of another process embodiment for forming a robust copper barrier layer for use in interconnect schemes in damascene and dual damascene processes.

FIG. 9 is a flowchart describing a suitable method embodiment for implementing a process for constructing a copper interconnect having a copper barrier as outlined in FIGS. 8A–8F in accordance with the principles of the present invention.

It is to be understood that in the drawings like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various method embodiments for forming conducting structures in layers of insulating materials will be disclosed. In particular, the formation of inlaid copper conducting structures in low-K dielectric materials having an improved copper barrier layer will be detailed.

One embodiment in accordance with the principles of the present invention is directed to a method of forming a bi-layer copper barrier film having improved robustness. The depicted embodiment begins by first providing a substrate in a processing chamber. The substrate has an insulating layer and an opening in the insulating layer on which the improved copper barrier layer will be formed. Then, at least one barrier layer is formed. The depicted embodiment shows forming a first barrier film, for example, by deposition of a tantalum (Ta) containing barrier material. A second barrier film is formed, for example, by deposition of a second barrier material (or combination of materials) that can include Chromium (Cr), Magnesium (Mg), Molybdenum (Mo), or Palladium (Pa). Also, other barrier materials having high conductivity, good adhesion with copper, and poor solubility in copper can be used to form a second barrier layer. Additionally, materials such as Vanadium (Va) or Tungsten (W) can be used. Subsequent to the formation of the second barrier film, a copper seed layer is formed over the surface. A layer of bulk copper is then formed on the surface of the copper seed layer. The substrate is then annealed to form a bi-layer copper barrier film. Further processing can then be implemented. Examples of such processing include, but are not limited to, planarizing the surface and building of further layers.

Another embodiment in accordance with the principles of the present invention is directed to a method of forming a copper interconnect structure that includes a copper barrier film having improved robustness. A portion of that process includes implanting a copper seed layer with certain barrier materials and bulk deposition of copper onto the implanted seed layer and then annealing the substrate to form the final barrier layer.

The following discussion describes the formation of semiconductor structures that include a copper layer having a robust bi-layer copper barrier film with improved resistance to copper electromigration. In particular, the principles of the present invention can be used with any current conducting layers that include copper containing materials, especially those used in damascene and dual damascene processes. The depicted embodiment is shown with respect to a via. However, it should be readily appreciated by those having ordinary skill in the art that other conductive structures including, but not limited to: interconnects, trenches, trenches overlying vias, contacts, interconnects through inter-level dielectrics (ILD's) and the like, can be constructed using the principles of the present invention.

FIGS. 6A–6F depict an exemplary process of forming a copper interconnect having a robust bi-layer copper barrier film. Such processes are compatible with so-called single damascene and dual damascene processes. FIGS. 6A–6F depict a cross-section view of a semiconductor surface. The structures depicted are similar to those shown in FIG. 3, which shows the topmost portion of FIG. 2. Such structures can be formed by conventional processes known to those having ordinary skill in the art. A plug 170 of conducting material is shown. In the depicted embodiment, the plug 170 is formed of a conducting material, for example, a copper containing material. An insulating layer 180 of dielectric material is formed having an opening 171 therein, the opening 171 being in communication with the plug 170. The dielectric material 180 can be silicon dioxide; however combinations of silicon dioxide and other doped dielectrics (e.g., BPSG, PSG) are also commonly used. Additionally, low-K dielectric materials or other electrically isolating materials are also used. The principles of the present invention find particular utility when applied to use with low-K dielectric materials. Examples include spin-on and CVD polymeric materials based on silicon or carbon, or based on combinations of silicon and carbon. Particular low-K materials include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-K materials include SiCOH or polymers of parylene and napthalene, copolymers of parylene with polysiloxanes or teflon, and polymers of polysiloxane.

In one embodiment, the at least one barrier layer can now be formed. Referring to FIG. 6B, a first barrier layer 200 is formed using tantalum-containing materials. Typical examples include, but are not limited to, tantalum, tantalum nitrides, and tantalum silicon nitrides (TaSiN). Alternatively, other materials such as Ti or TiN can also be used. Such a first barrier layer 200 can formed on the dielectric 180 and plug 170 surfaces using, for example, well-known sputter deposition, PVD, atomic layer deposition (ALD), chemical vapor deposition (CVD), or related techniques. Typical examples of related techniques, include, but are not limited to: metal-organic chemical vapor deposition (MOCVD), magnetically enhanced PVD, or IPVD (ionized PVD). Such techniques can be used to deposit a tantalum-containing film (e.g., Ta or TaN). A Ta film can be used to form the first barrier layer 200. The thickness of the Ta film is suitably selected in consideration of the desired thickness of the first barrier layer 200. Suitable thickness for a first barrier layer 200 is in the range of about 20 to 300 Ångstroms (Å) for many applications. With one preferred thickness being in the range of 100–150 Å.

In one embodiment, a tantalum first barrier layer 200 can be formed by deposition using PVD techniques. One suitable process employs a PVD machine, such as an Endura 5500 manufactured by Applied Materials of Santa Clara, Calif. One example of a suitable process operates at a power in the range of about 10–100 kW and a pressure in the range of about 0.05 mTorr to about 5 mTorr. One preferred implementation uses a power of about 24 kW at about 1 mTorr. This first barrier layer is formed to a thickness of about 20–300 Å, preferably about 100–150 Å.

Referring to FIG. 6C, a second barrier layer 201 can be formed over the first barrier layer 200. In the depicted embodiment the second barrier layer 201 is formed using magnesium (Mg), palladium (Pd), chromium (Cr), and molybdenum (Mo). Other materials, such as vanadium, tungsten or other related materials, can be used. Additionally, other materials having high conductivity, good adhesion with copper, and poor solubility in copper can also be used. Such a layer 201 can be formed on the dielectric 180 and plug 170 surfaces using a variety of techniques, such as discussed earlier with respect to the formation of the first barrier layer 200. For example, atomic layer deposition (ALD), chemical vapor deposition (CVD), physical vapor deposition (PVD), as well as variations thereof can be used. In one embodiment a Mg second barrier layer 201 can be formed by deposition using PVD techniques. One suitable process employs PVD machine (e.g., the Endura 5500) to deposit the Mg onto the first layer. Suitable process parameters include a power in the range of about 2 kW to 50 kW and a low pressure on the order of about $10^{-8}$ Torr. This second barrier layer 201 is formed to a thickness of about 5–50 Å, preferably about 5–20 Å.

Referring to FIG. 6D, a copper seed layer 202 is formed over the at least one barrier layer (here, the second barrier layer 201). The copper seed layer 202 is typically formed using PVD techniques, although other techniques known to those having ordinary skill in the art can also be used. A suitable method for forming a copper seed layer 202 is disclosed in U.S. Pat. No. 6,037,258 to Liu, et al. entitled "Method of Forming a Smooth Copper Seed Layer for a Copper Damascene Structure", which is hereby incorporated by reference. In one embodiment, the seed layer 202 can be formed by deposition using PVD techniques. One suitable process employs a PVD machine (e.g., the Endura 5500) at a power in the range of about 10–100 kW at a pressure of about 0.05 mTorr to about 5 mTorr. This seed layer 202 is formed to a thickness of about 50–100 Å.

Referring to FIG. 6E, a bulk copper layer 203 is formed over the copper seed layer 202. The bulk copper layer 203 is typically formed using bulk deposition techniques like electroplating. One suitable embodiment for forming the bulk copper barrier layer 203 using electroplating is described hereinbelow. This process employs an Applied Materials Electra ECP machine using a copper sulfate solution having a plating current of about 10 A/cm to 100 A/cm. The bulk copper layer 203 is plated until the opening 171 is filled.

Another embodiment can deposit the bulk copper layer 203 using electroless copper deposition. One method of accomplishing such electroless deposition of copper is disclosed in U.S. patent application Ser. No. 10/035,705, entitled "Electroless Deposition of Copper to Form Copper Interconnect Structures", filed concurrently herewith and hereby incorporated by reference. The inventors contemplate that other techniques known to those having ordinary skill in the art can be used to form the bulk copper layer 203.

After the formation of the bulk copper layer, the substrate is annealed. However, the inventors contemplate that the annealing can take place at any time after the deposition of the second barrier layer 201. One suitable process employs an annealing furnace, such as a vertical furnace manufactured by Semi Tool of Kalispell, Mont. Such annealing occurs in an inert gas at temperatures of about 250° C. to about 450° C. for about 5 minutes to about 60 minutes. A preferred process uses a temperature of about 350° C. for about 30 minutes. A preferred ambient is $N_2$, Ar, or other inert gas. Annealing forms a final composite bi-layer copper barrier layer having improved resistance to copper diffusion.

While not wishing to be limited by theory, it is believed that the deposited metal atoms migrate into the tantalum-containing barrier layer filling the grain boundary of the layer(s) and thereby providing a more robust copper barrier.

The surface can then be subjected to further processing. For example, the surface can be planarized as shown in FIG. 6F. Such planarization can be accomplished using, for example, chemical mechanical polishing (CMP) or electropolishing. After planarization, additional processing can be implemented. For example, other copper barrier layers can be formed to seal the bulk copper layer 203 in place. Also, further process layers can be constructed over the depicted layers.

FIG. 7 shows a flow diagram that depicts one embodiment of the above-described process. The method embodiment of FIG. 7 can be used to construct copper interconnects having a robust composite bi-layer copper barrier layer with improved resistance to copper diffusion. The method includes the steps of providing a wafer having formed thereon recesses in isolation structures so that copper interconnects can be formed therein (Step 701). Such structures can be formed using methods and materials known by one of ordinary skill in the art. One such structure is depicted hereinabove. A first barrier layer is formed in the openings and on the insulating layer (Step 703). A second barrier layer is formed on the first barrier layer (Step 705). The second barrier layer being formed of Cr, Mg, Mo, Pd, or other suitable materials. A copper seed layer is formed over the second barrier layer (Step 707). Over the copper seed layer is formed a bulk copper layer (Step 709). The wafer is annealed, thereby forming the first barrier layer and second barrier layer into a composite bi-layer copper barrier layer having increased resistance to copper diffusion (Step 711). The process may include optional further processing (Step 713). For example, the surface can be planarized. Also, further structures, including additional interconnects, can be fabricated over the surface. The present invention further covers semiconductor devices formed by the above method.

Yet another embodiment in accordance with the principles of the present invention is directed to a method of forming a copper interconnect structure that includes copper barrier film having improved robustness. A portion of that process includes implanting a copper seed layer with certain barrier materials and bulk deposition of copper onto the implanted seed layer and then annealing the substrate to form the final barrier layer. As with the previously described embodiments, the process is shown with respect to a via. However, as previously explained, it should be readily appreciated by those having ordinary skill in the art that other conductive structures can be constructed using the principles of the present invention.

FIGS. 8A–8F depict an exemplary process of forming a copper interconnect having a robust copper barrier film. As with the embodiments described hereinabove, the depicted process is compatible with so-called single damascene and dual damascene processes. FIGS. 8A–8F depict a cross-section view of a semiconductor surface. The structures depicted are similar to those of FIG. 6A. Such structures can be formed by conventional processes known to those having ordinary skill in the art. FIG. 8A depicts a substrate surface having a plug 170 of conducting material. In the depicted embodiment the plug 170 is formed of a copper-containing material. An insulating layer 180 of dielectric material is formed having an opening 171 therein. The opening 171 being in communication with the plug 170.

Referring to FIG. 8B, a copper seed layer 210 is formed over the opening 171 and the insulating layer 180. Electroless copper deposition, CVD, PVD and related technologies can be used to form the copper seed layer 210. A suitable PVD method for forming a copper seed layer 210 is disclosed in previously referenced U.S. Pat. No. 6,037,258 to Liu, et al. Such a method has been explained hereinabove. This seed layer 210 is formed to a thickness of about 50–100 Å.

Referring to FIG. 8C, the seed layer 210 is treated with an ion implantation device to form an implantation layer 212.

The ion implantation device is used to implant a barrier material into the copper seed layer 210. Such ion implantation is depicted by the arrows 211. Typical barrier materials include, Mg, Cr, Mo, and Pd. Other materials including, but not limited to: Ta, W, and V can also be selected. Other materials having: good conductivity; good adhesion with copper; and poor solubility in copper can be used. Additionally, combinations of the foregoing materials can be implanted. Suitable ion implanters are commercially available from, for example, Varian Semiconductor Equipment Assoc. Inc. of Gloucester, Mass. Implantation of the barrier material is conducted at high vacuum on the order of about $0$–$10^{-5}$ Torr. An implantation voltage in the range of about 3 kV (kilovolts) to about 3 MV (megavolts) can be used, the nature of the barrier material being implanted being a factor in determining the voltage. For a Mg barrier material, a preferred voltage is in the range of about 50 kV-2 MV. The implantation proceeds until a desired level of barrier material density is achieved. A range of about $10^{15}$–$10^{21}$ atoms per $cm^3$ is preferred. In one embodiment, an implantation ion of about $10^{17}$ magnesium atoms per $cm^3$ is satisfactory. One alternate embodiment for encasing the barrier materials in a copper seed layer is to form a portion of the seed layer 210, then form an inter-layer of barrier material on the portion of the seed layer. The inter-layer of barrier material can be formed in much the same manner as the second barrier layer 201 described hereinabove. The seed layer 210 is then completed by forming another layer of seed material over the inter-layer of barrier material.

Referring to FIG. 8D, a bulk copper containing layer 213 is formed over the implanted copper seed layer 212. The bulk copper containing layer 213 is typically formed of copper using bulk deposition techniques like electroplating. Suitable embodiments for forming the bulk copper barrier layer 213 using electroplating or electroless copper deposition are described hereinabove with respect to FIG. 6E. The inventors contemplate that other techniques known to those having ordinary skill in the art can be used to form the bulk copper layer 213. The bulk copper layer 213 is formed until the opening 171 is filled.

Referring to FIG. 8E, after the formation of the bulk copper layer 213, the substrate is annealed. As with the forgoing embodiment, annealing can be conducted at any point after the implantation of the barrier material. As described previously, such annealing can be conducted at temperatures of about 250° C. to about 450° C., preferably about 350° C. The annealing process continues for about 5 minutes to about 60 minutes, preferably for about 30 minutes in an inert ambient such as Ar or $N_2$. The annealing causes the implanted barrier material 212 (of FIG. 8D) to migrate through the copper of the seed layer 210 to the insulating material 180. This migration leads to the formation of a final barrier layer 220. This final barrier layer 220 has excellent resistance to copper diffusion into the dielectric insulating layer 180 and is therefore highly desirable.

The surface can also be subjected to further processing. For example, the surface can be planarized as shown in FIG. 8F. Such planarization can be accomplished using, for example, CMP or electropolishing. After planarization, additional processing can be implemented. For example, other copper barrier layers can be formed to seal the bulk copper layer 213 in place. Also, further process layers can be constructed over the depicted layers.

In other related embodiments, at least one barrier layer can be formed prior to the formation and implantation of a seed layer. For example, a first barrier can be formed prior to the formation of the seed layer 210. This first barrier layer is constructed similarly to that described with respect to FIG. 6B. The seed layer 210 is the formed on the first barrier layer. The process continues as described with respect to FIGS. 8C–8F (i.e., implantation, bulk deposition, annealing to form final barrier layer). During annealing, the implanted barrier materials migrate to the first barrier layer to form an enhanced final barrier layer.

In another related embodiment, a first barrier can be formed prior to the formation of the seed layer 210. This first barrier layer is constructed similarly to that described with respect to FIG. 6B. Additionally, a second barrier layer can be formed on the first barrier layer prior to the formation of the seed layer 210. The second barrier layer is typically formed as described with respect to FIG. 6C. The seed layer 210 is the formed on the second barrier layer. The process continues as described with respect to FIGS. 8C–8F (i.e., implantation, bulk deposition, annealing to form final barrier layer). During annealing, the implanted barrier materials migrate to the bi-layer barrier film to form another enhanced final barrier layer.

FIG. 9 shows a flow diagram that depicts one embodiment of the above-described process. The method embodiment of FIG. 9 can be used to construct copper interconnects having a robust copper barrier layer with improved resistance to copper diffusion. The method includes the steps of providing a wafer having formed thereon openings in insulating material so that inlaid copper conducting structures can be formed therein (Step 901). Such structures can be formed using methods and materials known by one of ordinary skill in the art. One such structure is depicted hereinabove. A copper seed layer is formed over the insulating materials and openings thereon (Step 903). The copper seed layer is implanted with a barrier material (Step 905). Over the implanted copper seed layer is formed a bulk copper layer (Step 907). The wafer is annealed, thereby causing the implanted barrier materials to migrate so that an improved copper barrier layer having increased resistance to copper diffusion is formed (Step 909). The process may include optional further processing (Step 911). For example the surface can be planarized. Also further structures, including additional interconnects can be fabricated over the surface. Additional embodiments include an optional step of, prior to seed layer formation (Step 903), forming at least one barrier layer on the insulating materials and openings thereon. For example, forming a first barrier layer on the insulating materials and openings thereon (Step 902A), after which a seed layer is formed over the first barrier layer (Step 903). In another alternative embodiment, formation of the seed layer (Step 903) is preceded by the steps of: forming a first barrier layer on the insulating materials and openings thereon (Step 902A); forming a second barrier layer on the first barrier layer (Step 902B); and forming the seed layer over the second barrier layer (Step 903). The present invention further covers a semiconductor device formed by the above method.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that barrier layers in accordance with the principles of the present invention can be practiced with a number of different materials having high conductivity, poor solubility in copper, and good adhesion to a copper-containing layer. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for forming a copper interconnect having a robust copper barrier layer, the method comprising:

providing a substrate having an insulating layer and an opening in the insulating layer configured to receive an inlaid conducting structure;

forming a copper seed layer on the insulating layer and in the opening;

implanting the seed layer with barrier material ions that consist of ions selected from ions in the group: palladium, chromium, and molybdenum, to form an implanted seed layer;

forming a bulk copper-containing layer on the implanted seed layer; and annealing the substrate, so that the barrier material ions migrate through the seed layer to an interface between the seed layer and the insulating layer to form a final barrier layer.

2. The method of claim 1 wherein the insulating layer is comprised of a low-K dielectric material.

3. The method of claim 1 wherein forming the bulk layer of copper-containing material comprises electroplating the copper containing material onto the seed layer.

4. The method of claim 1, wherein forming the bulk layer of copper-containing material comprises electroless deposition of the copper-containing material onto the seed layer.

5. The method of claim 1, wherein the opening is a via.

6. The method of claim 1, wherein the opening is a trench.

7. The method of claim 1, wherein the opening is a combination of a trench overlying a via.

8. A method for forming a copper interconnect having a robust copper barrier layer, the method comprising:

providing a substrate having an insulating layer and an opening in the insulating layer configured to receive an inlaid conducting structure;

forming at least one barrier layer on the insulating layer and in the opening;

forming a copper seed layer on the at least one barrier layer;

implanting the seed layer with barrier material ions that consist of a material selected from the group: palladium, tantalum, magnesium, and molybdenum, to form an implanted seed layer;

forming a bulk copper-containing layer on the implanted seed layer; and annealing the substrate so that the barrier material ions migrate through the seed layer to the interface between the at least one barrier layer and the copper seed layer to form a final barrier layer.

9. The method of claim 8 wherein forming the at least one barrier layer comprises:

forming a first barrier layer on the insulating layer and in the opening; and forming a second barrier layer on the first barrier layer.

10. The method of claim 9 wherein:

the insulating layer is comprised of a low-K dielectric material;

the first barrier layer is comprised of material is selected from among tantalum and tantalum nitride; and wherein the second barrier layer consists of a material selected from the group: palladium, chromium, tantalum, magnesium, and molybdenum.

11. The method of claim 8, wherein forming the bulk layer of copper-containing material comprises electroplating the copper containing material onto the implanted seed layer.

12. The method of claim 8, wherein forming the bulk layer of copper-containing material comprises electroless deposition of the copper containing material onto the implanted seed layer.

13. The method of claim 9 wherein:

the insulating layer is comprised of a low-K dielectric material;

the first barrier layer is comprised of material is selected from among tantalum and tantalum nitride; and wherein the second barrier layer consists of a material selected from the group: palladium, tantalum, magnesium, and molybdenum.

14. A method for forming a copper interconnect having a robust copper barrier layer, the method comprising:

providing a substrate having an insulating layer and an opening in the insulating layer configured to receive an inlaid conducting structure;

forming a copper seed layer;

implanting the seed layer with barrier material ions selected from ions in the group: palladium and molybdenum to form an implanted seed layer;

forming a bulk copper-containing layer on the implanted seed layer; and annealing the substrate, so that the barrier material ions migrate through the seed layer to an interface between the seed layer and the insulating layer to form a final barrier layer.

15. The method of claim 14 wherein forming the copper seed layer comprises forming the copper seed layer on the insulating layer and in the opening.

16. The method of claim 14 further including forming at least one barrier layer on the insulating layer and in the opening;

wherein forming the copper seed layer comprises forming a copper seed layer on the at least one barrier layer; and wherein annealing comprises annealing the substrate so that the barrier material ions migrate through the seed layer to the interface between the at least one barrier layer and the copper seed layer to form a final barrier layer.

17. The method of claim 15 wherein the insulating layer is comprised of a low-K dielectric material.

18. The method of claim 15 wherein forming the bulk layer of copper-containing material comprises electroplating the copper containing material onto the seed layer.

19. The method of claim 15, wherein forming the bulk layer of copper-containing material comprises electroless deposition of the copper-containing material onto the seed layer.

20. The method of claim 16 wherein forming the at least one barrier layer comprises:

forming a first barrier layer on the insulating layer and in the opening; and forming a second barrier layer on the first barrier layer.

21. The method of claim 16 wherein:

the insulating layer is comprised of a low-K dielectric material;

the first barrier layer is comprised of material is selected from among tantalum and tantalum nitride; and wherein the second barrier layer consists of a material selected from the group: palladium, chromium, tantalum, magnesium, and molybdenum.

* * * * *